United States Patent
Ram et al.

(10) Patent No.: US 11,067,631 B2
(45) Date of Patent: Jul. 20, 2021

(54) METHODS FOR DETERMINING AN ALTERNATE CURRENT MOTOR FAULT IN A NON-VARIABLE FREQUENCY DEVICE BASED ON CURRENT ANALYSIS

(71) Applicant: Panoramic Power Ltd., Kfar-Saba (IL)

(72) Inventors: Yaron Ram, Holon (IL); Yehoshua Rosenberg, Nokdim (IL); Adi Shamir, Kidron (IL)

(73) Assignee: Panoramic Power Ltd., Kfar-Saba (IL)

( * ) Notice: Subject to any disclaimer, the term of this patent is extended or adjusted under 35 U.S.C. 154(b) by 0 days.

(21) Appl. No.: 17/117,768

(22) Filed: Dec. 10, 2020

(65) Prior Publication Data

US 2021/0096188 A1 Apr. 1, 2021

Related U.S. Application Data

(63) Continuation of application No. PCT/IB2020/050126, filed on Jan. 8, 2020.
(Continued)

(51) Int. Cl.
*H02P 23/14* (2006.01)
*G01R 31/34* (2020.01)
(Continued)

(52) U.S. Cl.
CPC ........... *G01R 31/343* (2013.01); *G01M 13/04* (2013.01); *H02P 23/14* (2013.01); *H02P 29/024* (2013.01)

(58) Field of Classification Search
CPC ..... G01R 31/343; H02P 23/14; H02P 29/024; G01M 13/04
See application file for complete search history.

(56) References Cited

U.S. PATENT DOCUMENTS 3,506,914 A 4/1970 Albright et al.
4,808,932 A 2/1989 Schulz, Jr. et al.
(Continued)

FOREIGN PATENT DOCUMENTS

CA 3056311 A1 9/2018
GB 2534406 A 7/2016

OTHER PUBLICATIONS

Nordin, et al., "Detection and Classification of Induction Motor Faults Using Motor Current Signature Analysis and Multilayer Perceptron", 2014 IEEE 8th International Power Engineering and Optimization Conference PEOCO2014, Langkawi, The Jewel of Kedah, Malaysia, 2014, pp. 35-40.
(Continued)

*Primary Examiner* — Rina I Duda
(74) *Attorney, Agent, or Firm* — M&B IP Analysts, LLC

(57) ABSTRACT

A system and method for detection of a fault in a component of an Alternate Current Motor (ACM) based on current samples of the ACM. The system includes a current sensor for sampling a current of the ACM. The sampling is performed a plurality of times within a half-wave form of an Alternate Current (AC) of the ACM and over several cycles of half-waves. The system also includes a computing device for receiving the plurality of current samples. The computing device is configured to analyze a plurality of current samples of the AC of the ACM, the plurality of current samples taken for at least several periods of half-waves of the AC, determine, based on the analysis of the plurality of current samples, whether the ACM is a Variable Frequency Drive (VFD) or a non-VFD, and report that fault detection cannot be made if the ACM is a VFD.

19 Claims, 9 Drawing Sheets

Related U.S. Application Data

(60) Provisional application No. 62/789,748, filed on Jan. 8, 2019.

(51) Int. Cl.
*G01M 13/04* (2019.01)
*H02P 29/024* (2016.01)

(56) References Cited

U.S. PATENT DOCUMENTS

| | | | |
|---|---|---|---|
| 5,049,815 | A | 9/1991 | Kliman |
| 5,519,337 | A | 5/1996 | Casada |
| 5,739,698 | A | 4/1998 | Bowers et al. |
| 7,081,760 | B2 | 7/2006 | Mirafzal et al. |
| 7,592,772 | B2 | 9/2009 | Nandi et al. |
| 7,957,166 | B2 * | 6/2011 | Schnetzka ............ H02M 7/003 363/56.03 |
| 8,014,110 | B2 * | 9/2011 | Schnetzka ............ H02P 27/08 361/31 |
| 8,174,853 | B2 * | 5/2012 | Kane ............ H02M 7/003 363/40 |
| 8,405,339 | B2 | 3/2013 | Zhang et al. |
| 8,712,671 | B2 | 4/2014 | Adachi et al. |
| 8,994,359 | B2 | 3/2015 | Neti et al. |
| 9,054,589 | B2 | 6/2015 | Cheng et al. |
| 9,134,348 | B2 | 9/2015 | Shamir |
| 9,151,802 | B2 | 10/2015 | Donolo |
| 9,169,742 | B2 | 10/2015 | Dooley et al. |
| 9,389,276 | B2 | 7/2016 | Nandi et al. |
| 9,391,495 | B2 | 7/2016 | Wilson et al. |
| 9,541,606 | B2 | 1/2017 | Neti et al. |
| 9,618,583 | B2 | 4/2017 | Liu |
| 9,645,046 | B2 | 5/2017 | Zhang et al. |
| 9,678,113 | B2 | 6/2017 | Shamir et al. |
| 9,678,114 | B2 | 6/2017 | Shamir et al. |
| 9,891,252 | B2 | 2/2018 | Shamir et al. |
| 2008/0048603 | A1 * | 2/2008 | Discenzo ............ G05B 19/4063 318/561 |
| 2014/0303913 | A1 | 10/2014 | Neti et al. |
| 2015/0260794 | A1 | 9/2015 | Athikessavan et al. |
| 2016/0011268 | A1 | 1/2016 | Tsai et al. |
| 2016/0230688 | A1 | 8/2016 | Nakanishi et al. |
| 2016/0266208 | A1 | 9/2016 | Athikessavan et al. |
| 2019/0101436 | A1 | 4/2019 | Li et al. |

OTHER PUBLICATIONS

Benbouzid, "A Review of Induction Motor Signature Analysis as a Medium for Fault Detection", IEEE Transaction on Industrial Electronic, vol. 47, No. 5, Oct. 2000, pp. 984-993.

Frosini, et al., "Stator Current and Motor Efficiency as Indicators for Different Types of Bearing Faults in Induction Motors", IEEE Transactions on Industrial Electronics, vol. 57, No. 1, Jan. 2010, pp. 244-251.

Ghorbanian, et al., "A Survey on Time and Frequency Characteristics of Induction Motors with Broken Rotor Bars in Line-Start and Inverter-Fed Modes", Mechanical Systems and Signal Processing 54-55 (2015), pp. 427-456.

Krishna, et al., "Fault Diagnosis of Induction Motor using Motor Current Signature Analysis", 2013 International Conference on Circuits, Power and Computing Technologies [ICCPCT-2013], pp. 180-186.

Miljković, "Brief Review of Motor Current Signature Analysis", Croatia, 1015, pp. 15-26.

Pires, et al., "Motor Square Current Signature Analysis for Induction Motor rotor Diagnosis", Measurement 46, 2013, pp. 942-948.

Rangel-Magdaleno, et al., "Hilbert Spectrum Analysis of Induction Motors for the Detection of Incipient Broken Rotor Bars", Measurement 109, 2017, pp. 247-255.

Siddiqui, et al., "Health Monitoring and Fault Diagnosis in Induction Motor—A Review", International Journal of Advanced Research in Electrical, Electronics and Instrumentation Engineering, vol. 3, Issue 1, 2014, pp. 6549-6565.

Singh, et al., "Effectiveness of Current Envelope Analysis to Detect Broken Rotor Bar and Inter Turn Faults in an Inverter Fed Induction Motor Drive", 2015 International Conference on Power and Advanced Control Engineering (ICPACE), pp. 191-194.

The International Search Report and the Written Opinion of the International Searching Authority for PCT/IB2020/050126, ISA/IL, Jerusalem, Israel, dated Apr. 26, 2020.

Wang, et al., "Concordia Transform-Based Current Analysis for Induction Motor Diagnosis", Key Engineering Materials vols. 569-570, 2013, pp. 481-488.

First Examination Report for UK Patent Application GB2020435.0, dated Jan. 19, 2021, South Wales, UK.

* cited by examiner

METHODS FOR DETERMINING AN ALTERNATE CURRENT MOTOR FAULT IN A NON-VARIABLE FREQUENCY DEVICE BASED ON CURRENT ANALYSIS

CROSS-REFERENCE TO RELATED APPLICATIONS

This application is a continuation of International Application No. PCT/IB2020/050126 filed Jan. 8, 2020 which claims the benefit of U.S. This application claims the benefit of U.S. Provisional Application No. 62/789,748 filed on Jan. 8, 2019 the contents of which are hereby incorporated by reference.

TECHNICAL FIELD

The present disclosure generally relates to detection of faults of Alternate Current Motors (ACMs), and more specifically, to detecting of such faults based on analysis of the current waveform of an ACM.

BACKGROUND

A typical Alternate Current (AC) Motor (ACM), as shown in FIG. 1, includes several key components such as the stator, rotor and bearings. Each of these components may exhibit various electrical and mechanical faults. For example, stator failures may include winding and other external failures. Also, rotor failures may include breakage of various parts of the rotor that impacts the rotor's performance. Additionally, mechanical faults may be exhibited by the likes of eccentricity faults or bearing faults.

According to various surveys bearing faults amount to at least 40% of the failures, stator failures amount to about one third of the failures, and less than 10% are due to rotor failures. Regardless of the reason for the failure, these failures are difficult to identify, especially before actual failure of the components, so as to allow for preventive, rather than reactive maintenance.

It has been shown that it is possible to analyze the current consumed by the ACM to determine the condition or health of the ACM and detect fault that may result in a failure of the ACM. The term "fault" refers herein to a condition prior to the actual failure of the ACM, but still at a poor condition for the ACM.

For example, FIG. 2A depicts a bar diagram of frequencies of a healthy ACM (i.e., an ACM functioning at a good condition). As can be seen, assuming that a 50 Hz alternate current is provided to the ACM, the primary frequency is 50 Hz and harmonics of that, (i.e., 100 Hz, 150 Hz, 200 Hz, 250 Hz, and so on) appear in diminishing amplitude. In contrast, FIG. 2B shows a bar diagram of frequencies of an ACM having a broken bar. A slip is caused in this case by an asynchronous rotor. Therefore, frequencies lower than 50 Hz appear, as well as at some higher frequencies, beyond those which are harmonics of the base 50 Hz frequency. FIG. 2B shows a case of a broken bar where a frequency slip caused by the asynchronous rotor can be clearly observed.

Further, FIG. 2C shows a case of a faulty stator where a $3^{rd}$ harmonic is dominant at 150 Hz. Analysis may be performed by using Fast Fourier Transform (FFT), or by envelop analysis using the Hilbert transform. Based on the analysis it is possible to determine the type of fault. Typically, stator faults will present higher harmonics that are relatively easy to detect. Also, bearing faults will present higher harmonics, and while different from those of the stator faults, are also relatively easy to detect. However, rotor faults require the detection of low and close frequencies, which may be difficult to detect.

Further, there are additional challenges in detecting faults in systems that have different types components. For example, some of the analysis may not be applicable to certain types of engines that include a Variable Frequency Drive (VFD), which is also referred to as Adjustable Speed Drive (ASD), Variable Speed Drive (VSD), Adjustable Frequency Drive (AFD), Variable Voltage, Variable Frequency (VVVF), frequency inverter or just inverter. Here, reference will be made consistently to VFD for simplicity and convenience only. Furthermore, it is difficult for the analysis to be applied to systems employing many different kinds of electrical motors.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a method for detection of a fault in a component of an Alternate Current Motor (ACM) based on current samples of the ACM. The method includes analyzing a plurality of current samples of an Alternate Current (AC) of the ACM, the plurality of current samples taken over at least several periods of half-waves of the AC, determining, based on the analysis of the plurality of current samples, whether the ACM is a Variable Frequency Drive (VFD) or a non-VFD, reporting that fault detection for the ACM is unable to be made upon determination that the ACM is a VFD, analyzing the plurality of current samples upon determination that the ACM is a non-VFD to determine a status of the ACM, and reporting the status of the ACM based on the analysis.

Certain embodiments disclosed herein also include a system for detection of a fault in a component of an Alternate Current Motor (ACM) based on current samples of the ACM. The system includes a current sensor for sampling a current of the ACM. The sampling is performed a plurality of times within a half-wave form of an Alternate Current (AC) of the ACM and over several cycles of half-waves. The system also includes a computing device for receiving the plurality of current samples. The computing device is configured to analyze a plurality of current samples of the AC of the ACM, the plurality of current samples taken for at least several periods of half-waves of the AC, determine, based on the analysis of the plurality of current samples, whether the ACM is a Variable Frequency Drive (VFD) or a non-VFD, report that fault detection is unable to be made upon determination that the ACM is a VFD, analyze the plurality of current samples upon determination that the ACM is a non-VFD to determine a status of the ACM, and report the status of the ACM based on the analysis.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
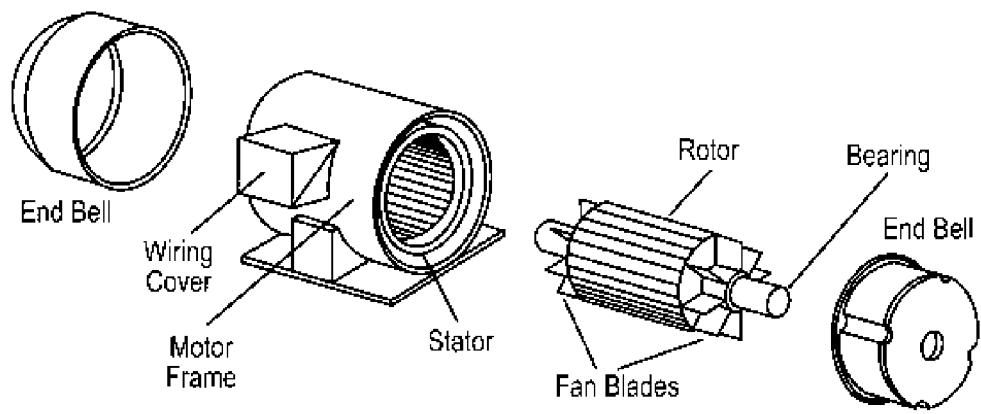
FIG. 1 is a diagram of an engine according to related art.
Figure 2A:
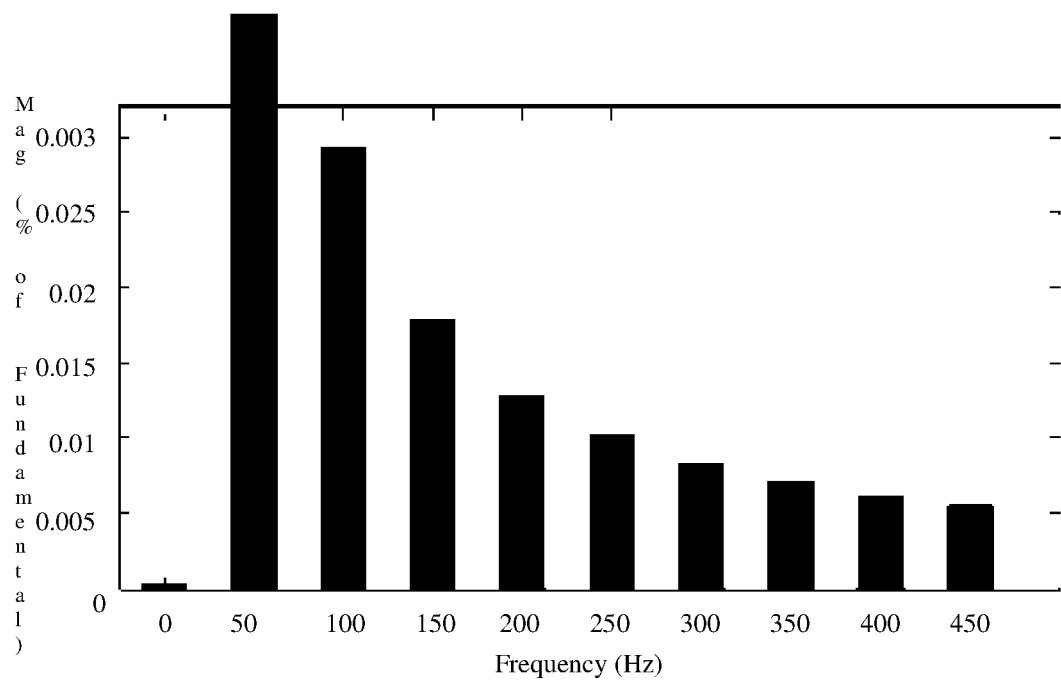
FIG. 2A is a bar diagram of frequencies of an engine in good condition according to related art.
Figure 2B:
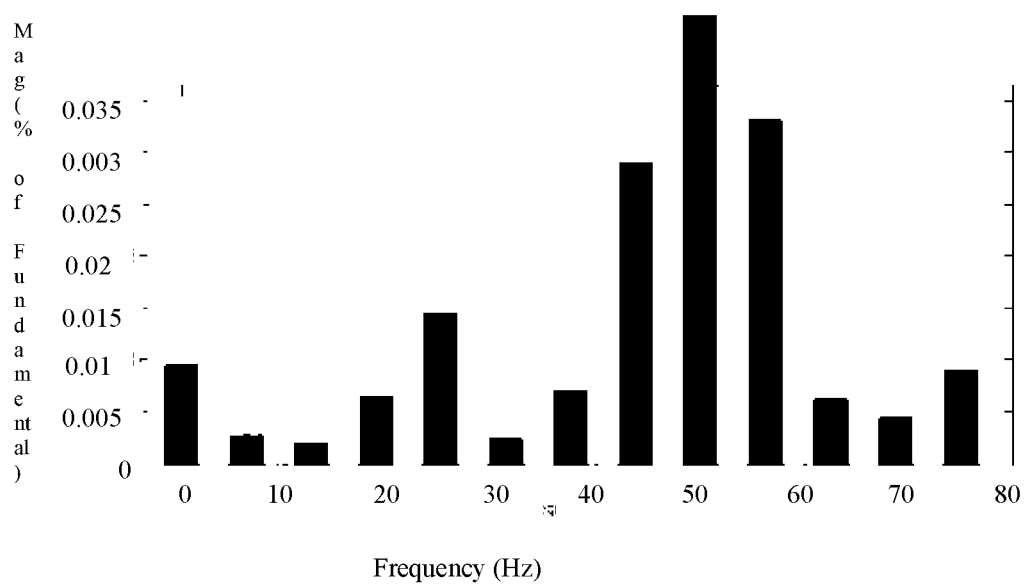
FIG. 2B is a bar diagram of frequencies of an engine having a broken bar according to related art.
Figure 2C:
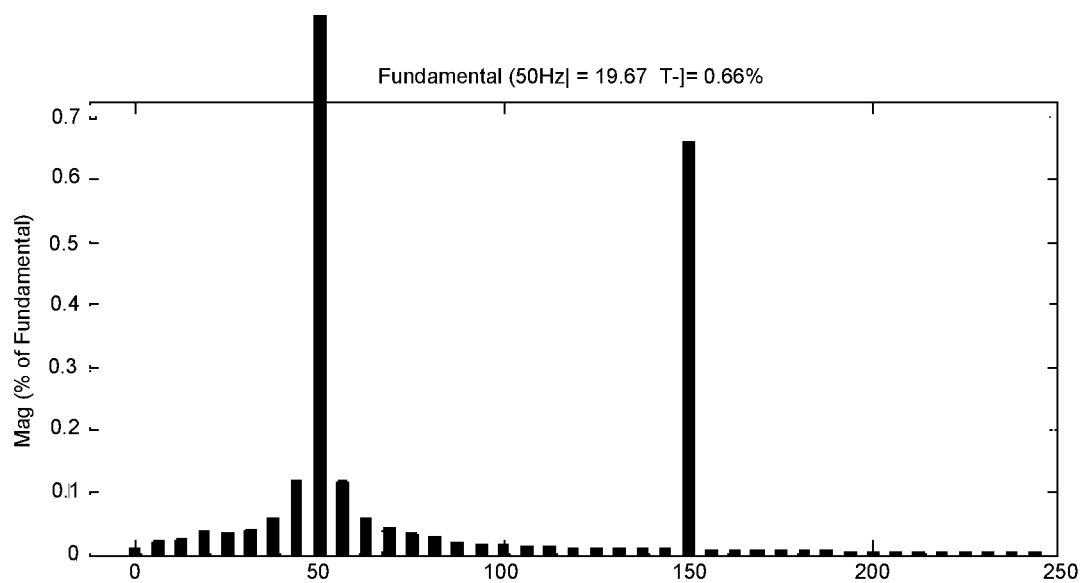
FIG. 2C is a bar diagram of frequencies of an engine having a stator fault according to related art.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

The various disclosed embodiments include a method and system for enabling determination of faults in non-Variable Frequency Drive (VFD) electrical motors. Also, the method and system allow for automatically excluding non-VFD electrical motors.

In general, a failure of Alternate Current (AC) Motors (ACMs) may occur as a result of electrical or mechanical faults. By analyzing the frequencies of the current consumed by an ACM, it is possible to determine the ACM's condition or to predict particular faults that may develop into a failure of the ACM. Prior to such a determination, it is necessary to first perform any analysis that determines whether the ACM has a non-Variable Frequency Drive (non-VFD), and refrain from analysis when it is determined that the ACM is a VFD.

Then, for non-VFD ACMs, a sampling of a half-wave of the current is analyzed, in order to determine if the ACM is healthy/in good condition, or if the ACM is about to fail. The fault types of the ACM may then be determined as rotor, stator, bearing or undetermined fault. Such analysis may be performed periodically, without interfering with the continuous operation of the ACM.

Figure 3:
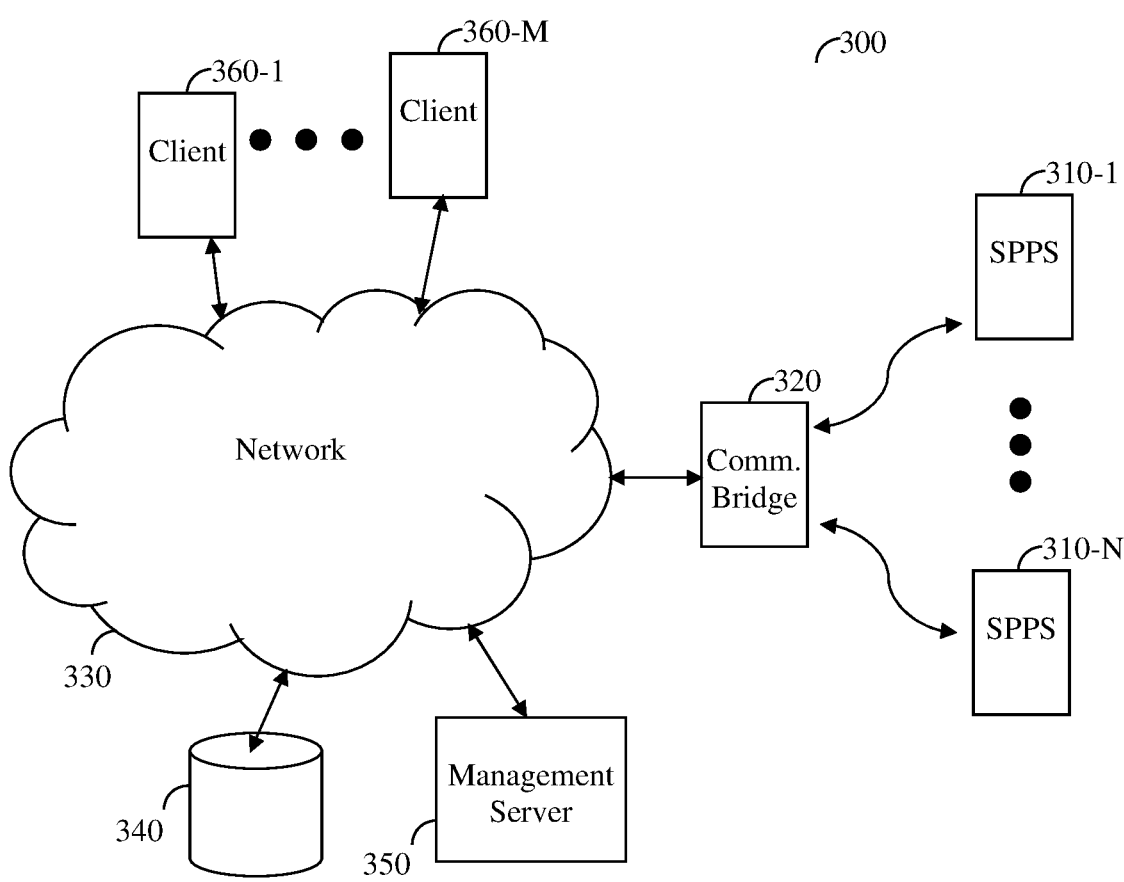
FIG. 3 is a diagram of a network system utilized to describe the various disclosed embodiments.

FIG. 3 shows an example diagram of a system 300 utilized to describe the various embodiments. The system 300 includes a plurality of Self-Powered Power Sensors (SPPSs) 310-1 through 310-N, where N is a natural number, communicatively connected to a communication bridge 320 (wired or wireless). According to the embodiment an SPPS 310, for example SPPS 310-1, may be measuring the current consumed by an ACM as further detailed herein.

A management server 350 is equipped with a transceiver (not shown) that enables communication with the plurality of SPPSs 310 using one or more communication schemes, which may be wired or wireless.

The communication bridge 320 may be configured to communicate with these SPPSs 310 using, for example, but not limited to, their respective Media Access (MAC) addresses. The communication bridge 320 is coupled to a network 330 which may be, but is not limited to, a Local Area Network (LAN), a Wide Area Network (WAN), a Metro Area Network (MAN), the Internet, the World Wide Web (WWW), and the like, whether wired or wireless, and in any combinations thereof. Communication links may be, but are not limited to, a Wireless LAN (WLAN), such as for example those of IEEE 802.11 set of LAN protocols, also known as WiFi®, a wireless sensor area network such as IEEE 802.15.4 also known as Zigbee®, Power Line Communication (PLC), or a cellular to modem network such as General Packet Radio Services (GPRS) or Code Division Multiple Access (CDMA).

In one embodiment, the communication bridge 320 is configured to aggregate the data from the plurality of SPPSs 310-1 to 310-N prior to sending it to the network 330. At the network 330 a database 340 is connected to the network 330 to accumulate data collected by the communication bridge 320. In particular data respective of the current waveform is collected by sampling the current from an ACM (not shown) which is monitored, for example, by SPPS 310-1.

Further connected to the network 300 is a management server 350 that provides client 360-1 (of clients 360-1 through 360-M, where M is a natural number), with processed information from data collected and stored in the database 340. The management server 350 may communicate with other application software as well.

While SPPS 310 is described here as a sensor of choice, this should not be viewed as limiting on the scope of the sensors that may be used. In fact, other current sensor, powered or self-powered, wired or wireless, may be used to provide the current samples consumed by an electrical motor.

Figure 4A:
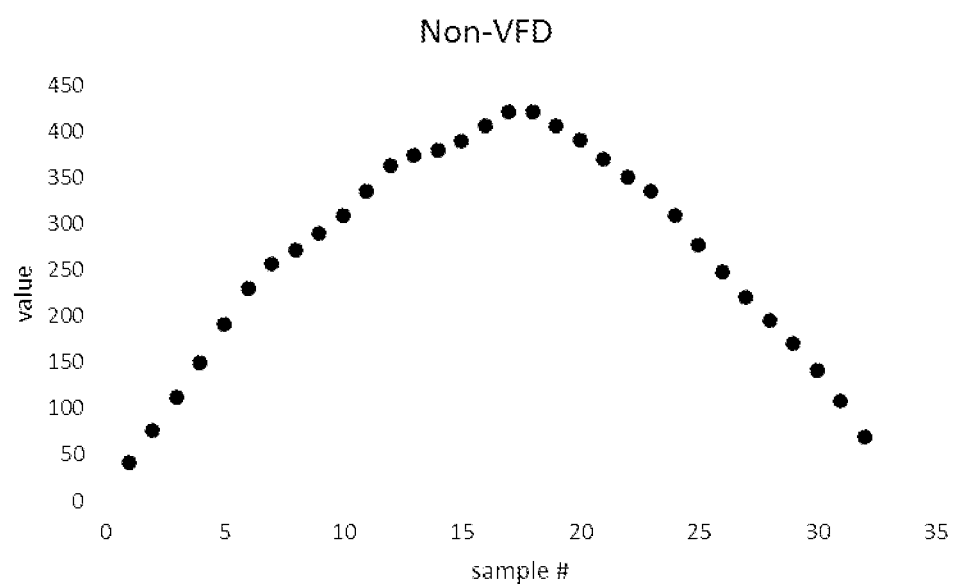
FIG. 4A is a diagram of a sampling of a current half wave by a sensor of a non-VFD according to an embodiment.

FIG. 4A is an example diagram of a sampling of a current half wave by a sensor such as SPPS 310 according to an embodiment. Samples of the alternating current are gathered of a half-wave at a sufficient frequency to allow required analyses to be performed. In one example, but not by way of limitation, 32 current samples per half-wave (i.e., some 3,000 samples per second) are made by the sensor, such as the SPPS 310-1. In another example, the sensor (e.g. the SPPS 310-1) is adapted to periodically send, once every fifteen minutes, the samples measured during that period of the half wave of the AC. This allows analyses to be performed to determine the types of faults presented by the ACM, if any.

Figure 4B:
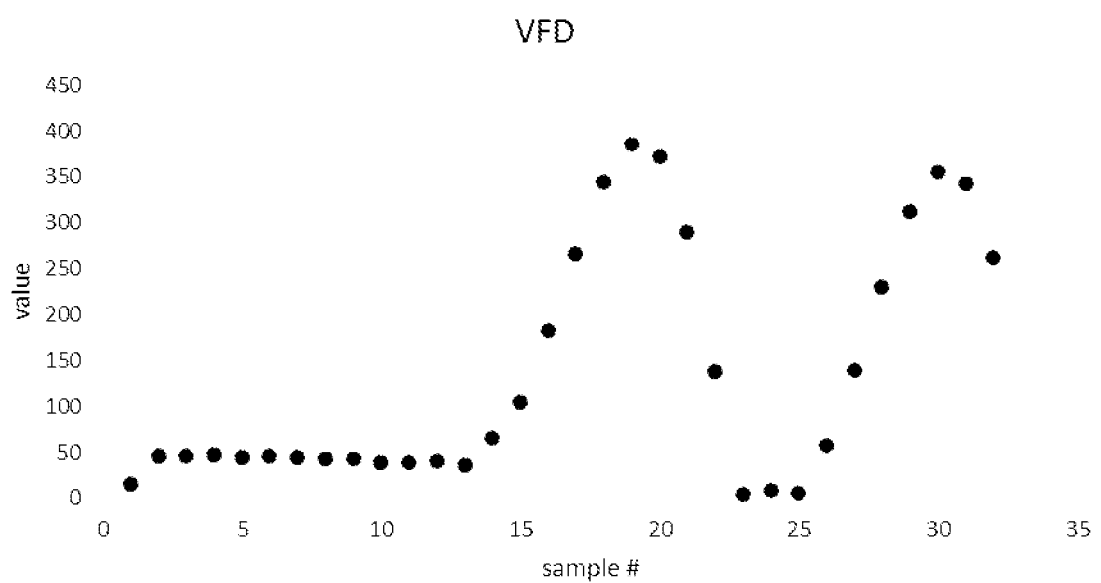
FIG. 4B is a diagram of a sampling of a current half wave by a sensor of a VFD according to an embodiment.

FIG. 4B depicts an example diagram of a sampling of a current half wave by a sensor of a VFD according to an embodiment. It is noted that VFD is also referred to as Adjustable Speed Drive (ASD), Variable Speed Drive (VSD), Adjustable Frequency Drive (AFD), Variable Voltage, Variable Frequency (VVVF), frequency inverter or just inverter. Herein, reference will be made consistently to VFD for simplicity and convenience only. A Fast Fourier Transform (FFT) can only successfully be used on ACMs that are non-VFDs, since ACM which are VFDs, do have inherent harmonics.

According to an embodiment, a Dynamic Time Warping (DTW) may be used to exclude VFDs from the analysis, and as further described herein. The DTW is used for measuring similarities between two temporal sequences that may vary in speed. This is performed by analyzing the current samples of the half-wave, and determining if these are more similar or closely matched to or resembles the profile of that of either the current samples of an VFD ACM or a non-VFD ACM.

Figure 5:
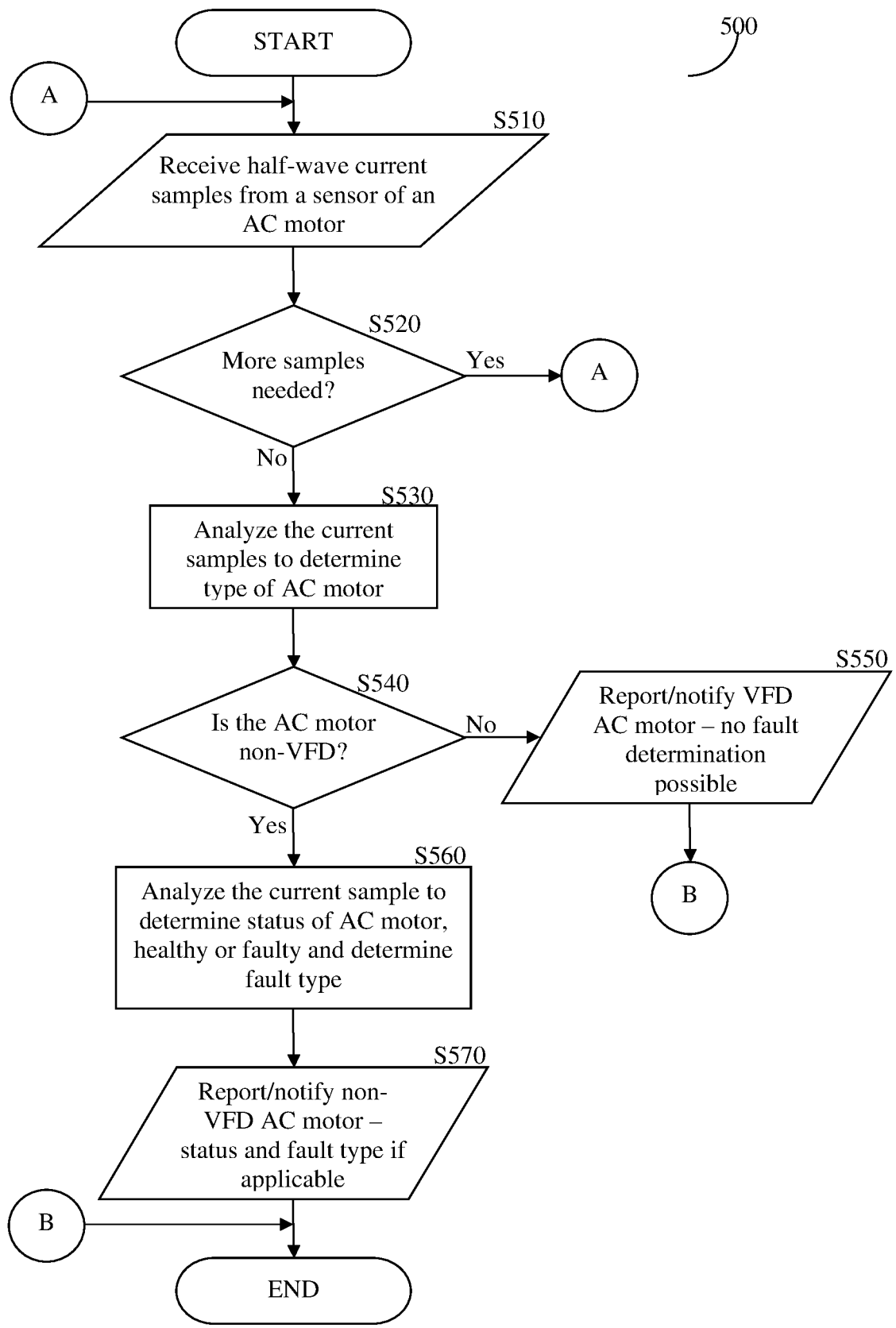
FIG. 5 is a flowchart of a method to detect electrical engine faults of non-VFDs in an environment having both VFDs and non-VFDs according to an embodiment.

FIG. 5 shows an example flowchart 500 of a method of detecting faults of non-VFD ACMs in an environment having both VFD ACMs and non-VFD ACMs according to an embodiment.

In an example embodiment, the process is performed by the management server 350, for example, for one device, but if multiple devices need to be checked, the same process may be applied to each device, either serially or in parallel using parallel computing techniques which are outside the scope of the disclosed embodiments.

At S510, a plurality of half-wave samples is received from a sensor, for example SPPS 310-1. The number of samples within the half-cycle sampled is typically 32 and is performed once per a period of time, for example, once every fifteen minutes. In one embodiment, from the 32 samples typically two samples are omitted, usually the last two samples. The rest are then normalized to be between '0' and '1' by subtracting the minimum (typically the first sample) from all of the samples, and then dividing all of the samples by the maximum sample value. This omission of two samples are done in order to prevent erroneous use of samples belonging to a sampling of a previous half wave.

At S520, it is checked if a sufficient number of samples have been received. If not, execution returns to S510, so that an accumulation of samples can continue; otherwise, execution continues with S530.

At S530, an analysis of the half-cycle waveforms takes place to determine if the samples received are from a non-VFD or a VFD ACM. In an embodiment, a DTW analysis may be performed to exclude VFDs from the analysis.

At S540 it is checked to see if the samples received are from a non-VFD ACM. If so, execution continues with S560. Otherwise, execution continues with S550.

At S550, for example, a notification or a report is provided to inform that a particular ACM is a VFD, and therefore cannot be checked for faults. After providing such notification or report, the execution ends.

At S560 the current samples of the ACM, established to be a non-VFD, are analyzed, for example by performing an FFT analysis. The various harmonics resulting from the FFT analysis may be compared against the healthy/good-conditioned and faulty frequency spectra expected for each case, and a determination may be made as to the specific status of the non-VFD ACM. This may include, but is not limited to, determination that the ACM is healthy/in good condition or is faulty. The faults may be determined to be caused by the stator, rotor or bearings, as well as a determination that a fault that does not fit a particular known pattern, but which is not the spectrum of frequencies associated with a non-VFD ACM that is in good condition.

At S570, a notification or a report is provided as to the particular status of the ACM after which execution ends.

It should be appreciated that the system and method described include an automatic detection of VFD ACMs, and eliminates them from the analysis, thereby avoiding false detections of faults attributed to an ACM erroneously simply because of its nature as a VFD. Secondly, the sampling rate required for the particular solution is lower than is with the related art, due to the technique used where the VFD ACMs have been identified. This allows operation of the system at a frequency of about 3 KHz versus at least 5 KHz as is typical in related arts.

Moreover, another simplification is the use of the half-wave sampling, (i.e., sampling only half of a sinus wave that still generates sufficient frequency-spectrum for detection of the fault). Therefore, the method provided herein allows for an unsupervised method that may be used to determine the status of non-VFD ACMs in an environment where both VFD ACMs and non-VFD ACMs are present. Here, there is no need for a user to enter input parameters, or determine whether a particular result may be false. In other words, with the system and method as described, human intervention is eliminated.

Furthermore, the solution allows for early detection of faults in ACMs. As the patterns of the frequency-spectrum change, when a predetermined threshold is crossed, an alert may be issued that the ACM is exhibiting early fault characteristics. Typically, early preventive action may avoid the need of failure maintenance which may occur at unexpected and unscheduled times.

It should be appreciated that faults refer to problems of the ACM prior to a failure of the ACM, (i.e., when the ACM become non-operational). In one embodiment of the invention information regarding patterns of faults are stored in database 340. The management server 350 may then periodically apply machine learning and/or Artificial Intelligence (AI) techniques to determine based on past experience fault trends regarding a non-VFD ACM based on its particular frequency-spectrum in comparison to other like ACMs.

Figure 6:
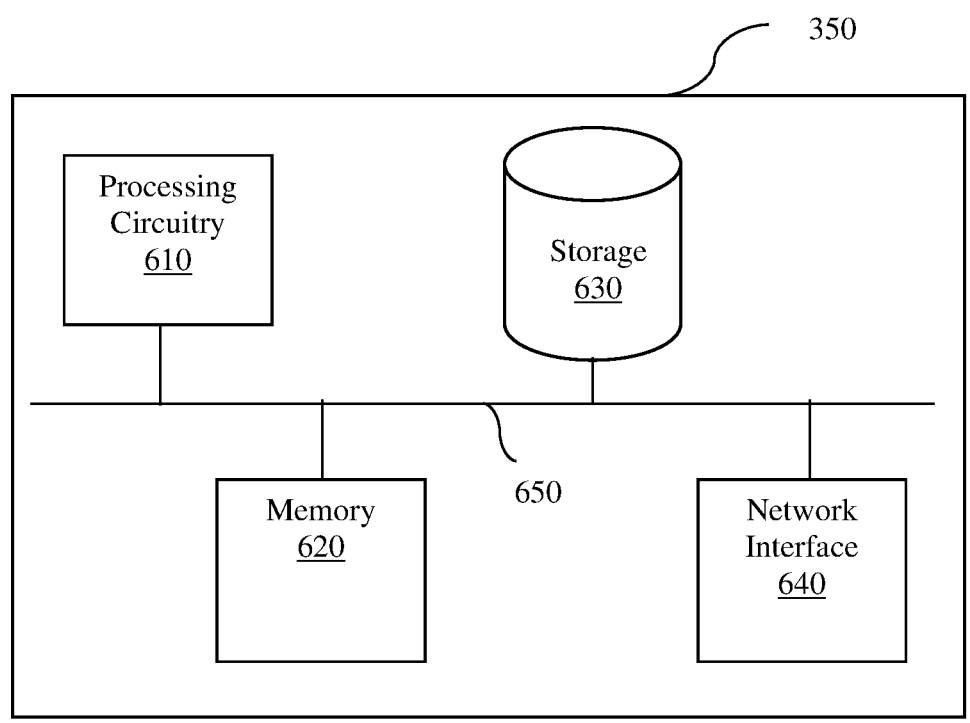
FIG. 6 is an example schematic diagram of a management server according to an embodiment.

FIG. 6 is an example schematic diagram of a management server 350 according to an embodiment. The management server 350 includes a processing circuitry 610 coupled to a memory 620, a storage 630, and a network interface 640. In an embodiment, the components of the management server 350 may be communicatively connected via a bus 650.

The processing circuitry 610 may be realized as one or more hardware logic components and circuits. For example, and without limitation, illustrative types of hardware logic components that can be used include Field Programmable Gate Arrays (FPGAs), Application-Specific Integrated Circuits (ASICs), Application-Specific Standard Products (ASSPs), System-On-a-Chip systems (SOCs), Graphics Processing Units (GPUs), general-purpose microprocessors, microcontrollers, Digital Signal Processors (DSPs), and the like, or any other hardware logic components that can perform calculations or other manipulations of information.

The memory 620 may be volatile (e.g., RAM, etc.), non-volatile (e.g., ROM, flash memory, etc.), or a combination thereof.

In one configuration, software for implementing one or more embodiments disclosed herein may be stored in the storage 630. In another configuration, the memory 640 is configured to store such software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the processing circuitry 610, cause the processing circuitry 610 to perform the various processes described herein, and in particular the process describe with reference to FIG. 5.

The storage 630 may be magnetic storage, optical storage, and the like, and may be realized, for example, as flash memory or other memory technology, CD-ROM, Digital Versatile Disks (DVDs), or any other medium which can be used to store the desired information.

The network interface 640 allows the sever 350 to communicate with, for example, the sensors 310.

It should be understood that the embodiments described herein are not limited to the specific architecture illustrated in FIG. 6, and other architectures may be equally used without departing from the scope of the disclosed embodiments.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine comprising any suitable architecture. Preferably, the machine is implemented on a computer platform having hardware such as one or more Central Processing Units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, (i.e., any elements developed that perform the same function), regardless of structure.

What is claimed is:

1. A method for detecting a fault in a component of an Alternate Current Motor (ACM) based on current samples of the ACM comprising:
    analyzing a plurality of current samples of an Alternate Current (AC) of the ACM, the plurality of current samples taken over at least several periods of half-waves of the AC;
    determining, based on the analysis of the plurality of current samples, whether the ACM is a Variable Frequency Drive (VFD) or a non-VFD;
    reporting that fault detection for the ACM is unable to be made upon determination that the ACM is a VFD;
    analyzing the plurality of current samples upon determination that the ACM is a non-VFD to determine a status of the ACM; and
    reporting the status of the ACM based on the analysis.

2. The method of claim 1, wherein determining whether the ACM is a VFD or a non-VFD further comprises:
    performing a Dynamic Time Warping (DTW) analysis of the plurality of current samples; and
    determining whether the plurality of current samples is closer to any one of:
        a current sample of an ACM which is a VFD; or
        a current sample of an ACM which is a non-VFD.

3. The method of claim 1, wherein the analysis of the plurality of current samples further comprises:
    performing a Fast Fourier Transform (FFT); and
    comparing results of the FFT to potential expected FFT results for ACMs.

4. The method of claim 3, wherein the expected FFT results are any one of:
    a healthy ACM;
    an ACM with a stator fault;
    an ACM with a rotor fault;
    an ACM with a bearing fault; or
    an undetermined ACM fault.

5. The method of claim 1, further comprising:
    sampling the half-waves at least 32 times per half cycle by a current sensor associated with the ACM; and
    omitting two last current samples of the plurality of current samples of each of the half-waves.

6. The method of claim 5, further comprising:
    normalizing the plurality of current samples of each half-wave to a value between 0 and 1.

7. The method of claim 1, further comprising:
    storing frequency-spectrum analysis of the non-VFD ACM in a database.

8. The method of claim 1. wherein analyzing the plurality of current samples further comprises:
    analyzing the plurality of current sample with respect to previously stored current samples of non-VFD ACMs.

9. A system for detection of a fault in a component of an Alternate Current Motor (ACM) based on current samples of the ACM, comprising:
    a current sensor for sampling a current of the ACM, wherein sampling is performed a plurality of times within a half-wave form of an Alternate Current (AC) of the ACM and over several cycles of half-waves;
    a computing device for receiving the plurality of current samples, the computing device configured to:
        analyze a plurality of current samples of the AC of the ACM, the plurality of current samples taken for at least several periods of half-waves of the AC;
        determine, based on the analysis of the plurality of current samples, whether the ACM is a Variable Frequency Drive (VFD) or a non-VFD;
        report that fault detection is unable to be made upon determination that the ACM is a VFD;
        analyze the plurality of current samples upon determination that the ACM is a non-VFD to determine a status of the ACM; and
        report the status of the ACM based on the analysis.

10. The system of claim 9, wherein the current sensor is a Self-Powered Power Sensor (SPPS).

11. The system of claim 9, wherein the current sensor is configured to:
    periodically send the plurality of current samples to the computing device.

12. The system of claim 9, wherein the computing device is further configured to:
    perform a Dynamic Time Warping (DTW) analysis of the plurality of current samples; and determine whether the plurality of current samples is closer to a current sample of an ACM, wherein the current sample of an ACM is any one of: a VFD or a current sample of an ACM which is a non-VFD.

13. The system of claim 9, wherein the computing device is further configured to:
perform a Fast Fourier Transform (FFT); and
compare results of the FFT to potential expected FFT results for ACMs.

14. The system of claim 13, wherein the expected FFT results include any one of:
a healthy ACM;
an ACM with a stator fault;
an ACM with a rotor fault;
an ACM with a bearing fault; or
an undetermined ACM fault.

15. The system of claim 9, wherein the computing device is further configured to:
sample the half-wave at least 32 times per half cycle by a current sensor associated with the ACM; and
omit two last current samples of the plurality of current samples of each half-wave.

16. The system of claim 15, wherein the system is further configured to:
normalize the plurality of current samples of each half-wave to a value between 0 and 1.

17. The system of claim 9, wherein the computing device is further configured to:
store frequency-spectrum analysis of the non-VFD ACM in a database.

18. The system of claim 9, wherein the computing device is further configured to:
analyze the plurality of current samples with respect to previously stored current samples of non-VFD ACMs.

19. A non-transitory computer readable medium having stored thereon instructions for causing a processing circuitry to execute a process for detecting a fault in a component of an Alternate Current Motor (ACM) based on current samples of the ACM comprising:
analyzing a plurality of current samples of an Alternate Current (AC) of the ACM, the plurality of current samples taken over at least several periods of half-waves of the AC;
determining, based on the analysis of the plurality of current samples, whether the ACM is a Variable Frequency Drive (VFD) or a non-VFD;
reporting that fault detection for the ACM is unable to be made upon determination that the ACM is a VFD;
analyzing the plurality of current samples upon determination that the ACM is a non-VFD to determine a status of the ACM; and
reporting the status of the ACM based on the analysis.

* * * * *